United States Patent [19]
Lee et al.

[11] Patent Number: 5,945,861
[45] Date of Patent: *Aug. 31, 1999

[54] CLOCK SIGNAL MODELING CIRCUIT WITH NEGATIVE DELAY

[75] Inventors: Jae Goo Lee, Kyungki; Sung Man Park, Seoul, both of Rep. of Korea

[73] Assignee: LG Semicon., Co. Ltd., Cheongju, Rep. of Korea

[ * ] Notice: This patent is subject to a terminal disclaimer.

[21] Appl. No.: 08/873,860

[22] Filed: Jun. 12, 1997

Related U.S. Application Data

[63] Continuation-in-part of application No. 08/587,745, Jan. 19, 1996, Pat. No. 5,708,382.

[30] Foreign Application Priority Data

Dec. 18, 1995 [KR] Rep. of Korea ...................... 95-51427

[51] Int. Cl.[6] .................................................. H03K 5/14
[52] U.S. Cl. .......................................... 327/277; 327/152
[58] Field of Search ..................................... 327/141, 152, 327/153, 161, 166, 176, 269, 270, 271, 276, 277, 284, 293

[56] References Cited

U.S. PATENT DOCUMENTS

| | | |
|---|---|---|
| 3,248,657 | 4/1966 | Turecki ................................... 327/269 |
| 3,588,707 | 6/1971 | Manship ................................. 327/152 |
| 3,619,669 | 11/1971 | Wheeler ................................. 327/265 |
| 4,443,766 | 4/1984 | Belton, Jr. .............................. 327/271 |
| 4,618,787 | 10/1986 | Jacksier et al. ........................ 327/262 |
| 4,675,612 | 6/1987 | Adams et al. .......................... 327/142 |
| 4,677,499 | 6/1987 | Shirota et al. ............................ 327/99 |
| 4,713,621 | 12/1987 | Nakamura et al. ...................... 327/152 |
| 5,313,501 | 5/1994 | Thacker .................................. 327/161 |
| 5,451,894 | 9/1995 | Guo ........................................ 327/241 |
| 5,465,076 | 11/1995 | Yamauchi et al. ....................... 327/277 |
| 5,467,041 | 11/1995 | Baba et al. .............................. 327/276 |
| 5,537,069 | 7/1996 | Volk ........................................ 327/149 |
| 5,589,788 | 12/1996 | Goto ........................................ 327/277 |

*Primary Examiner*—My-Trang Nu Ton
*Attorney, Agent, or Firm*—Fleshner & Kim

[57] ABSTRACT

The circuit of the present invention prevents a multi-locking phenomenon, reduces power consumption and provides an accurately locked internal clock signal. A delay unit sequentially delays an external clock signal through a plurality of unit delay terminals. A sampling and computation unit maintains the levels of signals from the unit delay terminals connected after a predetermined unit delay terminal, in which a locking phenomenon occurs, to a predetermined level when a delay clock signal among a plurality of delay clock signals from the unit delay terminals is locked. An output unit outputs a delay clock signal locked to an external clock signal in accordance with an output from the sampling and computation unit.

27 Claims, 4 Drawing Sheets

CLOCK SIGNAL MODELING CIRCUIT WITH NEGATIVE DELAY

This application is a Continuation-in-Part application of U.S. application Ser. No. 08/587,745, filed Jan. 19, 1996 now U.S. Pat. No. 5,708,382, which is hereby incorporated by reference.

BACKGROUND OF THE INVENTION

1. Field of the Invention

The present invention relates to a clock signal modeling circuit, and in particular, to a negative delay circuit having a multi-locking prevention circuit.

2. Background of the Related Art

As memory device technology advances, a memory device operates at higher speeds. The internal clock signal for a memory chip is generally obtained by delaying an external clock signal for a predetermined period time. However, there is a limit for delaying the external clock signal. For example, when accessing the data of the memory device using an internal clock signal which is based on a delayed external clock signal, the access time is increased.

Therefore, the delay time between an external clock signal and an internal clock signal is reduced by using a PLL(Phase Locked Loop) or a DLL(Delay Locked Loop) or the internal clock signal is generated more rapidly than the external clock signal. The process in which the internal clock signal is more rapidly generated than the external clock signal is called a negative delay. When using the PLL or DLL, a few hundreds of clock cycles are needed for providing a locked clock signal. In addition, the PLL or DLL increases the current consumption.

The above references and/or descriptions are incorporated by reference herein where appropriate for appropriate teachings of additional or alternative details, features and/or technical background.

SUMMARY OF THE INVENTION

An object of the present invention to provide a negative delay circuit which overcomes the problems of the related art.

Another object of the present invention is to reduce current consumption.

A further object of the present invention is to prevent a multi-locking phenomenon.

Still another object of the present invention is to provide an accurately locked clock signal.

The advantages, features and/or object may be achieved in whole or in part by maintaining the level of a signal to a predetermined level after a unit delay terminal in which a locking phenomenon occurs when a locking phenomenon occurs in a predetermined unit delay terminal in a high frequency region.

The present invention may be also achieved in part or in whole by a multi-locking prevention circuit for a negative delay circuit which includes a delay unit for sequentially delaying external clock signals through a plurality of unit delay terminals, a sampling and computation unit for maintaining the levels of signals from the unit delay terminals connected after a predetermined unit delay terminal, in which a locking phenomenon occurs, to a predetermined level when a delay clock signal among a plurality of delay clock signals from the unit delay terminals is locked, and an output unit form outputting a delay clock signal locked to an external clock signal in accordance with an output from the sampling and computation unit.

The present invention may be also achieved in part or in whole by a signal modeling circuit, comprising: a delay unit that sequentially delays a first signal to generate a plurality of delayed signals; and means for selecting one of the plurality of delayed signals when a transiting edge of the first signal is between two transiting edges of two delayed signals by a prescribed time period such that the selected delayed signal is outputted as a modeled signal.

Additional advantages, objects, and features of the invention will be set forth in part in the description which follows and in part will become apparent to those having ordinary skill in the art upon examination of the following or may be learned from practice of the invention. The objects, advantages and/or features of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
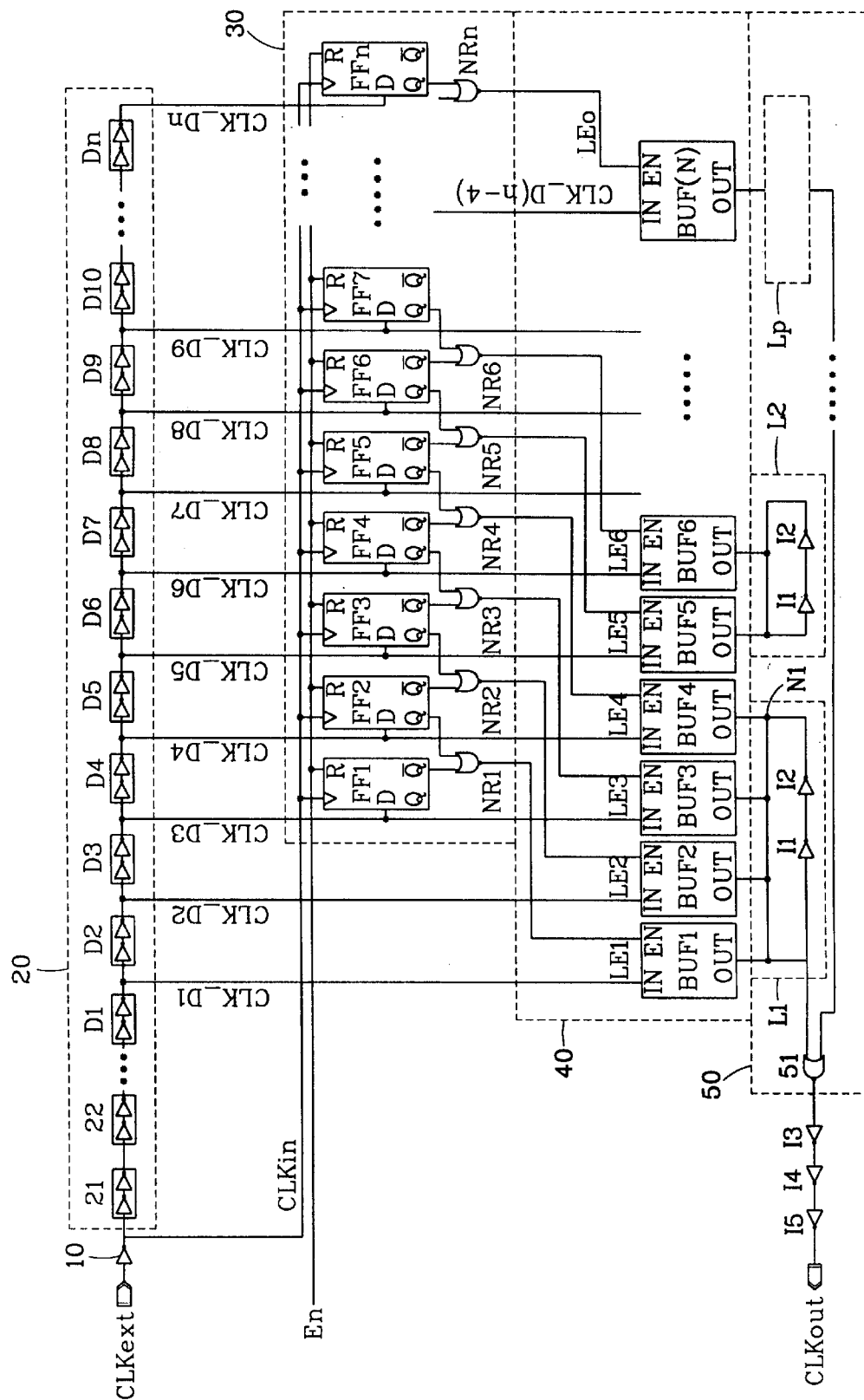
FIG. 1 is a circuit diagram illustrating a negative delay circuit in accordance with a first preferred embodiment of the present invention.

FIG. 1 illustrates a negative delay circuit in accordance with a first preferred embodiment, which includes an input buffer 10 receiving an external clock signal CLKext, a delay unit 20, a sampling unit and computation unit 30, an output unit having a first output unit 40 and a second output unit 50. The second output buffer 50 is coupled to a series of inverters 13, 14 and 15, which provide an internal clock signal CLKout.

The input buffer 10 buffers an external clock signal CLKext to provide a input clock signal CLKin. The delay unit 20 receives the input clock signal CLKin, and includes a plurality of unit delay terminals D1 through Dn, which sequentially delays the input clock signal CLKin from the input buffer 10 to provide a plurality of delayed clock signals CLK_D1–CLK_Dn. To provide the delay, the delay unit includes a plurality of inverters coupled in series. In this embodiment, two inverters are serially connected to form each unit delay terminal. Further, two extra unit delay terminals 21 and 22 are used to further delay the input clock signal CLKin. The extra unit delay terminals may or may not be used for coupling to the sampling and computation unit 30, and the number of inverters can be varied based on the desired delay for generating the plurality of delayed clock signals CLK_D1–CLK_Dn.

The sampling and computation unit 30 samples the delayed clock signals from the unit delay terminals in accordance with the clock signal CLKin, sequentially performs a logical operation on the same, and outputs locking enable signals LE1–LEo. In this preferred embodiment, the sampling and computation unit 30 includes a plurality of flip-flops FF1 and FFm and a plurality of NOR-gates NR1 to NRm.

Each flip-flop FF1 through FFm samples the corresponding delayed clock signal CLK_D1–CLK_Dn of corresponding unit delay terminals D1 through Dn received at each input terminal D with the input clock CLKin received at each clock terminal. Each set/reset terminal R of the flip-flops is coupled to receive an enable signal EN. The flip-flops are enabled by an enable signal EN of a high level, and are reset by an enable signal EN of a low level. The plurality of NOR-gates NR1 through NRm sequentially compares the outputs Q and /Q from the flip-flops FF1 through FFm and outputs a locking enable signal LEo.

When a delayed clock signal from a unit delay terminal is locked, e.g., when a transiting edge of the input clock signal CLKin is preferably about ½ in-between transiting edges of two delayed clock signals CLK_D(N-1) and CLK_Dn, the flip-flop coupled to the clock signal CLK_D(n-1) and the flip-flops thereafter output low and high level signals, respectively, at the output terminals Q and /Q of the flip-flops. The flip-flops coupled to the clock signal prior to CLK_D(n-1), i.e., flip-flops coupled to unlocked delayed signals of the unit delay terminal, output high and low levels at the output terminals Q and /Q, respectively, of the flip-flops.

FIG. 1 illustrates the flip-flops FF1–FFm coupled to sampled clock signals CLK_D1–CLK_Dn, respectively. However, the flip flops FF1–FFm may be coupled to any corresponding unit delay terminals D1–Dn, 21 and 22 in accordance with the frequency band, preferably between 70 MHz through 200 MHz, of an external clock signal CLKext. Further, various different flip-flops and other equivalent sampling devices may be used. Moreover, transiting edge of the input clock signal CLKin being about ½ in-between transiting edges of two delay clock signals CLK_D(n-1) and CLK_Dn may be varied.

The first output unit 40 includes tri-state or three phase buffers BUF1–BUF(N). When the buffer is enabled by a locking enable signal LEo if a high level, the output OUT of an enabled three-phase buffer provides the delayed clock signal CLK_Dn provided at the input In. The buffers which are disabled by the locking enable signal of a low level maintain a high impedance state at the output OUT. The buffers are staggerly coupled to the NOR gates of the sampling and computation unit 30. However, the buffers may be coupled in other staggered arrangements or directly coupled to the NOR gates without staggering.

The second output unit 50 includes a plurality of latches L1–Lp, each coupled to outputs OUT of the three phase buffers, and having first and second inverters 11 and 12. The outputs of the latches L1–Lp are logically NORed by a NOR gate 51 to provide an internal clock signal CLKout, which has been further delayed by serially connected inverters 13–15. The latch L1 is coupled to output OUT of four three-phase buffers whereas the latch L2 is coupled to output OUT of two three-phase buffers. As can be appreciated, such arrangements can be changed, and the inverters 13–15 may not be necessary.

The operation of the negative delay circuit of FIG. 1 is described with reference to FIGS. 2A–2H. When an external clock signal CLKext, as shown in FIG. 2A, the input clock signal CLKin of FIG. 2B from the input buffer 10 is sequentially delayed by the unit delay terminals D1 through Dn of the delay unit 20. See, e.g., FIGS. 2C–2F.

As shown in FIGS. 2E and 2F, the transiting edge of delayed clock signals CLK_D6 and CLK_D7 is about ½ in-between the transiting edge of the input clock signal CLKin, i.e., Δt1=Δt2. When such a condition is sampled by the sampling and computation unit 30, the flip-flops FF4–FFm output low and high.

The NOR gates NR1–NRm perform a logical NOR operation on the signals provided from the output terminals Q and /Q. The NOR gate NR4 outputs a lock enable signal LE4 whereas the remaining NOR gates NR1–NR3 and NR5–NRm provide enable signal LE1–LE3 and LE5–LEm of a low level. The enabled buffer BUF4 provides the delayed clock signal CLK_D4 to the output OUT, i.e., node N1 illustrated in FIG. 2G, which is latched by the latch L1 of the second output unit 50. The non-enabled buffers provide a high impedance state at the output OUT. The output from the latch L1 is NORed by the NOR gate 51, and the internal clock signal CLKout, as shown in FIG. 2H, is provided after being delayed by inverters 13–15.

Figure 3:
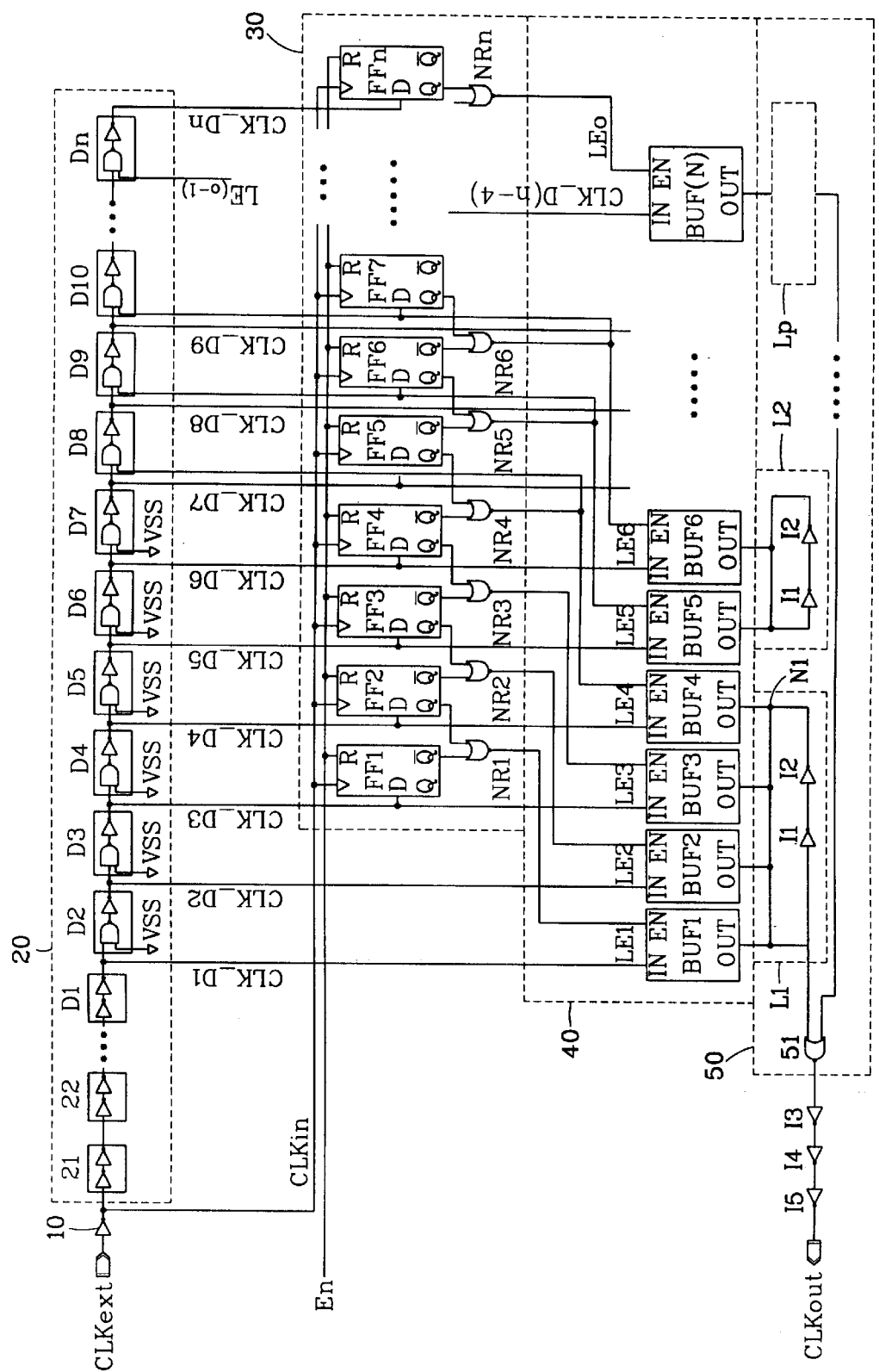
FIG. 3 is a circuit diagram illustrating a negative delay circuit having a multi-locking prevention circuit in accordance with a second preferred embodiment of the present invention.

FIG. 3 illustrates a negative delay circuit in accordance with a second preferred embodiment. This embodiment is similar to the FIG. 1 embodiment. However, each of the unit delay terminals D2–Dn comprises a NOR gate and an inverter. Further, one input of the NOR gates of unit delay terminals D1–D7 is coupled to a ground voltage Vss. The input of the NOR gates of unit delay terminals D8–Dn is coupled to receive a feedback output from NOR gates NR4–NRm, respectively. As can be appreciated, the feed back arrangement and the grounding of the NOR gates in the unit delay terminals D1–Dn can be varied.

Figure 2:
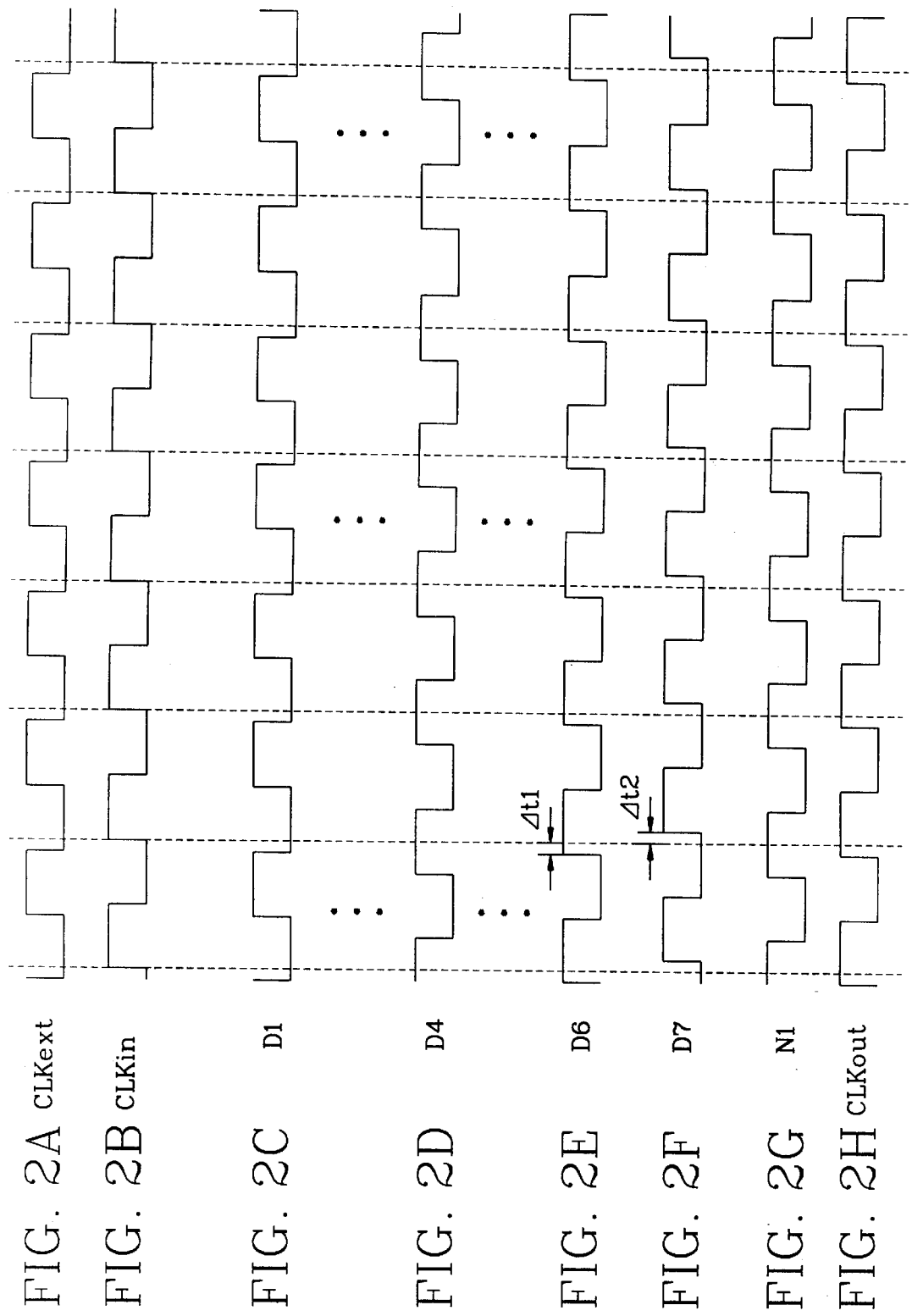
FIGS. 2A through 2H are waveform diagrams of signals within the circuit of FIG. 1.

The operation of the FIG. 3 embodiment is similar to the FIG. 1 embodiment with reference to the example illustrated in the timing diagram of FIG. 2. However, the locking enable signal LE4 of a high level fixes the delayed clock signals CLK_D8–CLK_Dn of unit delay terminals D8–Dn at a high level.

Figure 4:
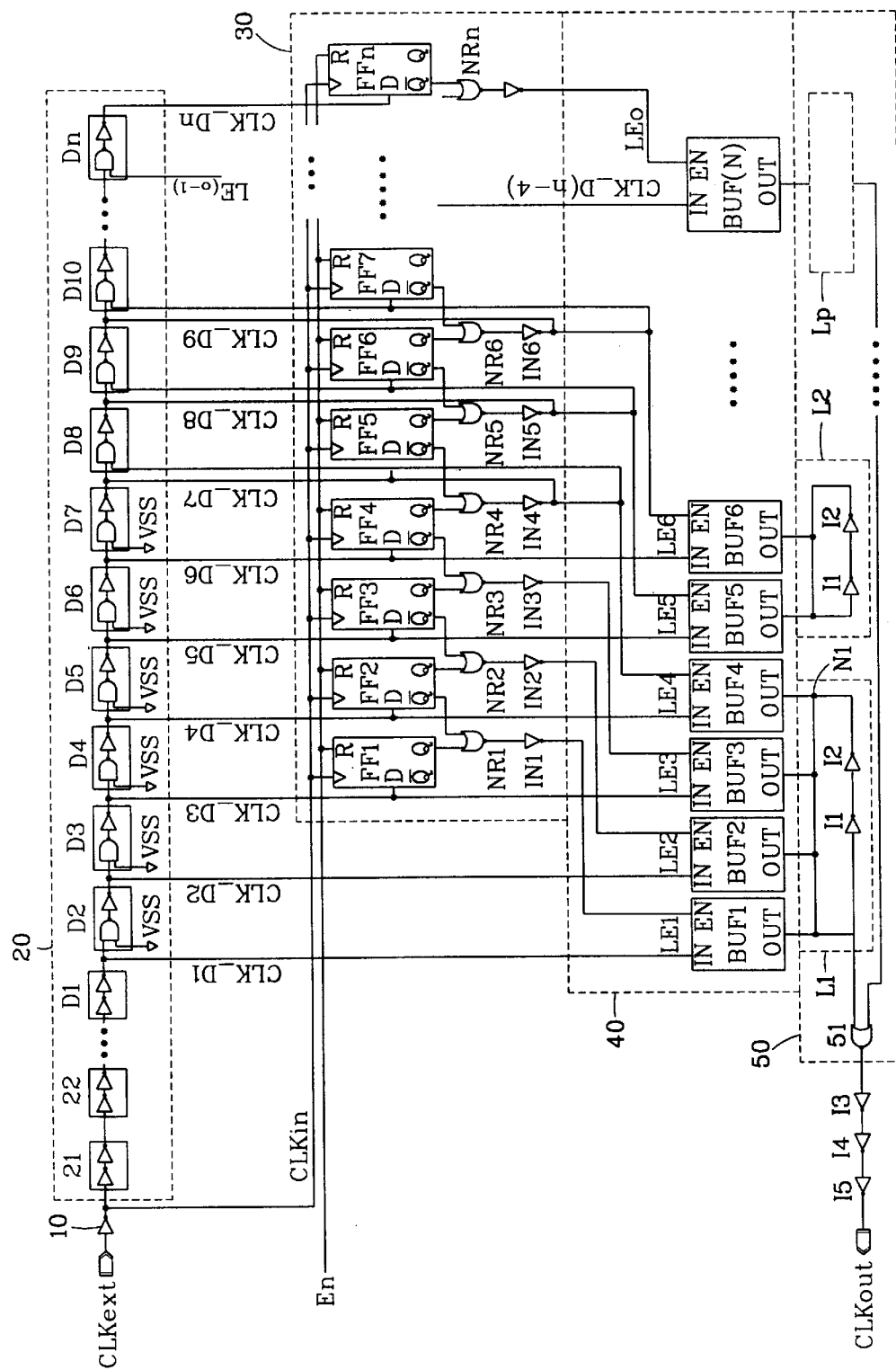
FIG. 4 is a circuit diagram illustrating a negative delay circuit having a multi-locking prevention circuit in accordance with a third preferred embodiment of the present invention.

FIG. 4 illustrates a negative delay circuit in accordance with a third preferred embodiment. This embodiment is similar to the FIG. 1 embodiment. However, each of the unit delay terminals D2–Dn comprises a NAND gate and an inverter. Further, one input of the NAND gates of unit delay terminals D1–D7 is coupled to a source voltage Vcc. Instead of using NOR gates, the sampling and computation unit includes a plurality of NAND gates ND1–NDm and a plurality of inverters INV1–INVm, wherein outputs from the flip-flops FF1–FFm to each NAND gate ND1–NDm are switched compared to the FIG. 1 embodiment. The input of the NAND gates of unit delay terminals D8–Dn is coupled to receive a feedback output from NAND gates ND–NDm, respectively. As can be appreciated, the feed back arrangement and the sourcing of the NAND gates in the unit delay terminals D1–Dn can be varied. The operation of the FIG. 4 embodiment is similar to the FIG. 1 embodiment with reference to the example illustrated in the timing diagram of FIG. 2, and is omitted for convenience.

As described above, a multi-locking prevention circuit for a negative delay circuit according to the present invention is capable of preventing a multi-locking phenomenon and reducing a current consumption by maintaining the levels of signals from the unit delay terminals connected after a unit delay terminal, in which a locking phenomenon occurs, to a predetermined level when a locking phenomenon occurs in a unit delay terminal in a high frequency region.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations as described above and others will be apparent to those skilled in the art.

What is claimed is:

1. A signal modeling circuit, comprising:
   a first delay unit that delays a first signal to generate a plurality of delayed signals; and
   a selector that selects one of said plurality of delayed signals when a transiting edge of the first signal is between two transiting edges of two delayed signals by a prescribed time period such that the selected delayed signal is outputted as a modeled signal, wherein the transiting edges of two delayed signals are about equal time period from the transiting edge of the first signal, wherein said selector includes an output unit which includes:
      a first output unit having a plurality of buffers and each buffer receiving a corresponding delayed signal; and
      a second output unit having a plurality of latches, each latch coupled to corresponding number of buffers and a logic gate for performing a logical operation based on the output signals of said plurality of latches to provide the model signal.

2. The signal modeling circuit of claim 1, wherein the first signal is an input clock signal of a buffered external clock signal.

3. The signal modeling circuit of claim 1, wherein said first delay unit includes a plurality of unit delay terminals for generating the plurality of delayed signals, respectively, each sequentially delaying the first signal.

4. The signal modeling circuit of claim 3, wherein each of said plurality of delayed unit terminals comprises a plurality of serially connected inverters.

5. The signal modeling circuit of claim 3, wherein each said plurality delayed unit terminals comprises a logic gate serially connected to an inverter.

6. The signal modeling circuit of claim 5, wherein corresponding logic gates of corresponding delayed unit terminals receives corresponding lock enable signals which indicate whether the transiting edge of the first signal is between transiting edges of two delayed signals by the prescribed time period.

7. The signal modeling circuit of claim 5, wherein said logic gate is a NOR gate.

8. The signal modeling circuit of claim 5, wherein said logic gate is a NAND gate.

9. The signal modeling circuit of claim 5, wherein corresponding input of corresponding logic gates is coupled to a prescribed voltage.

10. The signal modeling circuit of claim 9, wherein the prescribed voltage is one of a source voltage and a ground voltage.

11. The signal modeling circuit of claim 1, wherein said selector includes:
    a sampling and computation unit coupled to said first delayed unit that samples the plurality of delayed signals to determine whether the transiting edge of the first signal is between transiting edges of two delayed signals by the prescribed time period and outputs a plurality of locked enable signals, wherein
    said output unit is coupled to said sampling and computation unit to receive the locked enable signals and is coupled to said first delayed unit to receive said plurality of delayed signals, said output unit outputting one of said plurality of delayed signals as the modeled signal based on the locked enable signals.

12. The signal modeling circuit of claim 11, wherein said sampling and computation unit includes:
    a plurality of flip-flops, each receiving the first signal and a corresponding delayed signal; and
    a plurality of logic gates, each receiving an output from two of said plurality of flip-flops to output a lock enable signal.

13. The signal modeling circuit of claim 12, wherein said plurality of logic gates comprises a plurality of NOR gates.

14. The signal modeling circuit of claim 12, wherein each logic gate receives an output from two adjacent flip-flops.

15. The signal modeling circuit of claim 12, wherein said plurality of logic gate comprises a plurality of NAND gates coupled to receive the output from two of said plurality of flip-flops and a plurality of inverters coupled to said plurality of NAND gates.

16. The signal modeling circuit of claim 12, wherein each of said plurality of flip-flops are enabled and reset by an enable signal.

17. The signal modeling circuit of claim 11, wherein said buffers are tri-state buffers.

18. The signal modeling circuit of claim 11, wherein each of said plurality of latches comprises serially coupled inverters in a latch configuration.

19. The signal modeling circuit of claim 11, wherein said logic gate is a NOR gate.

20. The signal modeling circuit of claim 11, wherein an output of said logic gate is coupled to a second delay unit.

21. The signal modeling circuit of claim 20, wherein said second delayed unit comprises a plurality of serially connected inverters.

22. The signal modeling circuit of claim 1, wherein one of two delayed signals having an earlier transiting edge is outputted as the modeled signal.

23. A signal modeling circuit, comprising:
    a) a delay unit that delays a first signal to generate a plurality of delayed signals; and
    b) a sampling and computation unit coupled to said delayed unit that samples the plurality of delayed signals to determine whether a transiting edge of the first signal is between transiting edges of two delayed signals by a prescribed time period and outputs a control signal, wherein said sampling and computation unit includes:
       i) a plurality of flip-flops, each receiving the first signal and a corresponding delayed signal, and
       ii) a plurality of logic gates, each receiving an output from two of said plurality of flip-flops to output the control signal; and
    c) an output unit coupled to said sampling and computation unit to receive the control signal and coupled to said delayed unit to receive said plurality of delayed signals, said output unit outputting one of said plurality of delayed signals as the modeled signal based on the control signal.

24. The signal modeling circuit of claim 23, wherein said plurality of flip-flops are enabled and reset by an enable signal.

25. The signal modeling circuit of claim 23, wherein each logic gate receives an output from two adjacent flip-flops.

26. A signal modeling circuit, comprising:
    a) a first delay unit that delays a first signal to generate a plurality of delayed signals; and
    b) a sampling and computation unit coupled to said first delayed unit that samples the plurality of delayed signals to determine whether a transiting edge of the first signal is between transiting edges of two delayed signals by a prescribed time period and outputs a plurality of control signals; and an output unit coupled to said sampling and computation unit to receive the control signals and coupled to said first delayed unit to received said plurality of delayed signals, said output unit outputting one of said plurality of delayed signals as the modeled signal based on the control signals, wherein said output unit includes a first output unit having a plurality of buffers coupled to receive a corresponding delayed signal, wherein said output unit further includes a second output unit having a plurality of latches, each latch coupled to corresponding number of buffers and a logic gate for performing a logical operation based on the output signals of said plurality of latches to provide the model signal.

27. The signal modeling circuit of claim 26, wherein an output of said logic gate is coupled to a second delay unit.

* * * * *